United States Patent
Racey et al.

(10) Patent No.: US 9,071,202 B2
(45) Date of Patent: Jun. 30, 2015

(54) DOHERTY AMPLIFIER WITH PEAK BRANCH RF CONDITIONING

(71) Applicant: Alcatel-Lucent Canada Inc., Ottawa (CA)

(72) Inventors: Brian Racey, Ottawa (CA); Igor Acimovic, Gatineau (CA)

(73) Assignee: Alcatel Lucent, Boulogne-Billancourt (FR)

( * ) Notice: Subject to any disclaimer, the term of this patent is extended or adjusted under 35 U.S.C. 154(b) by 37 days.

(21) Appl. No.: 14/056,985

(22) Filed: Oct. 18, 2013

(65) Prior Publication Data

US 2015/0109058 A1    Apr. 23, 2015

(51) Int. Cl.
  *H03F 3/68*    (2006.01)
  *H03F 3/21*    (2006.01)
  *H03F 3/19*    (2006.01)

(52) U.S. Cl.
  CPC ............... *H03F 3/211* (2013.01); *H03F 3/19* (2013.01); *H03F 2203/21131* (2013.01); *H03F 2200/451* (2013.01); *H03F 2200/423* (2013.01)

(58) Field of Classification Search
  USPC .................. 330/295, 124 R, 84, 53–54, 286
  See application file for complete search history.

(56) References Cited

U.S. PATENT DOCUMENTS

| | | | |
|---|---|---|---|
| 6,262,629 | B1 | 7/2001 | Stengel et al. |
| 6,320,462 | B1 | 11/2001 | Alley |
| 6,617,929 | B2 | 9/2003 | Kim et al. |
| 6,714,071 | B1 | 3/2004 | Page |
| 7,342,444 | B2 | 3/2008 | Kim et al. |
| 7,521,995 | B1 | 4/2009 | Krvavac |
| 7,589,589 | B2 * | 9/2009 | Kusunoki ................. 330/51 |
| 7,714,648 | B2 | 5/2010 | Okubo et al. |
| 8,180,303 | B2 | 5/2012 | Dupuy et al. |
| 8,188,789 | B2 | 5/2012 | Woo et al. |
| 8,441,326 | B1 | 5/2013 | Bromberger |
| 2010/0315162 | A1 | 12/2010 | Gajadharsing et al. |

(Continued)

FOREIGN PATENT DOCUMENTS

EP    2159912 A1    3/2010

OTHER PUBLICATIONS

Hammi, et al., "Design and Performance Analysis of Mismatched Doherty Amplifiers Using an Accurate Load-Pull-Based Model," IEEE Transactions on Microwave Theory and Techniques, Aug. 2006, vol. 54, No. 8, pp. 3246-3254.

(Continued)

*Primary Examiner* — Hieu Nguyen
(74) *Attorney, Agent, or Firm* — Mendelsohn, Drucker & Dunleavy, P.C.

(57) ABSTRACT

In one embodiment, a Doherty amplifier having a main amplifier branch and one or more peak amplifier branches, where at least one peak amplifier branch has RF conditioning applied to its peak branch input signal such that the peak amplifier branch is active only when the peak branch input signal is greater than a specified threshold level. In one implementation, a reverse-biased diode is configured between the peak branch input signal and a peak amplifier device, where the bias signal applied to the diode establishes the specified threshold level. Depending on the implementation, the bias signal may be static or dynamic, and multiple peak amplifier branches may have diodes with independently or dependently generated bias signals applied.

16 Claims, 5 Drawing Sheets

(56) References Cited

U.S. PATENT DOCUMENTS

2012/0126891 A1 5/2012 Kim et al.
2013/0154745 A1 6/2013 Onizuka

OTHER PUBLICATIONS

Darraji et al., "Generic Load-Pull-Based Design Methodology for Performance Optimisation of Doherty Amplifiers," IET Sci. Meas. Technol., 2012, vol. 6, Iss. 3, pp. 132-138.

Colantonio et al., "The Doherty Power Amplifier," International Journal of Microwave and Optical Technology, Nov. 2010, vol. 5, No. 6, pp. 419-430.

Rawat, K., "Load-Pull Assisted CAD Design of Inverted Doherty Amplifier Without Quarter-Wave Transformer," 25th IEEE Canadian Conference on Electrical and Computer Engineering (CCECE), 2012.

Kim, B., et al., "The Doherty Power Amplifier," Micorwave Magazine, IEEE, vol. 7, No. 5, Oct. 2006, pp. 42-50.

International Search Report and Written Opinion; Mailed Dec. 23, 2014 for corresponding PCT Application No. PCT/CA2014/050996.

\* cited by examiner

DOHERTY AMPLIFIER WITH PEAK BRANCH RF CONDITIONING

BACKGROUND

1. Field

The present invention relates to electronics and, more specifically but not exclusively, to Doherty amplifiers.

2. Description of the Related Art

This section introduces aspects that may help facilitate a better understanding of the invention(s). Accordingly, the statements of this section are to be read in this light and are not to be understood as admissions about what is in the prior art or what is not in the prior art.

A Doherty amplifier has a main amplifier branch and one or more peak amplifier branches that are configured to assist the main amplifier branch in the amplification process when the applied input signal is relatively large. At relatively low input signal levels, the peak amplifier branches are inactive, and amplification is performed only by the main amplifier branch. In conventional Doherty amplifiers, the input signal level at which a peak amplifier branch becomes active is controlled by appropriately biasing the transistor(s) used to implement the branch's peak amplifier. Such biasing imposes a tradeoff between gain and linearity on the one hand and efficiency on the other, such that increased gain and linearity are achieved at the expense of lower efficiency, and vice versa.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Figure 1:
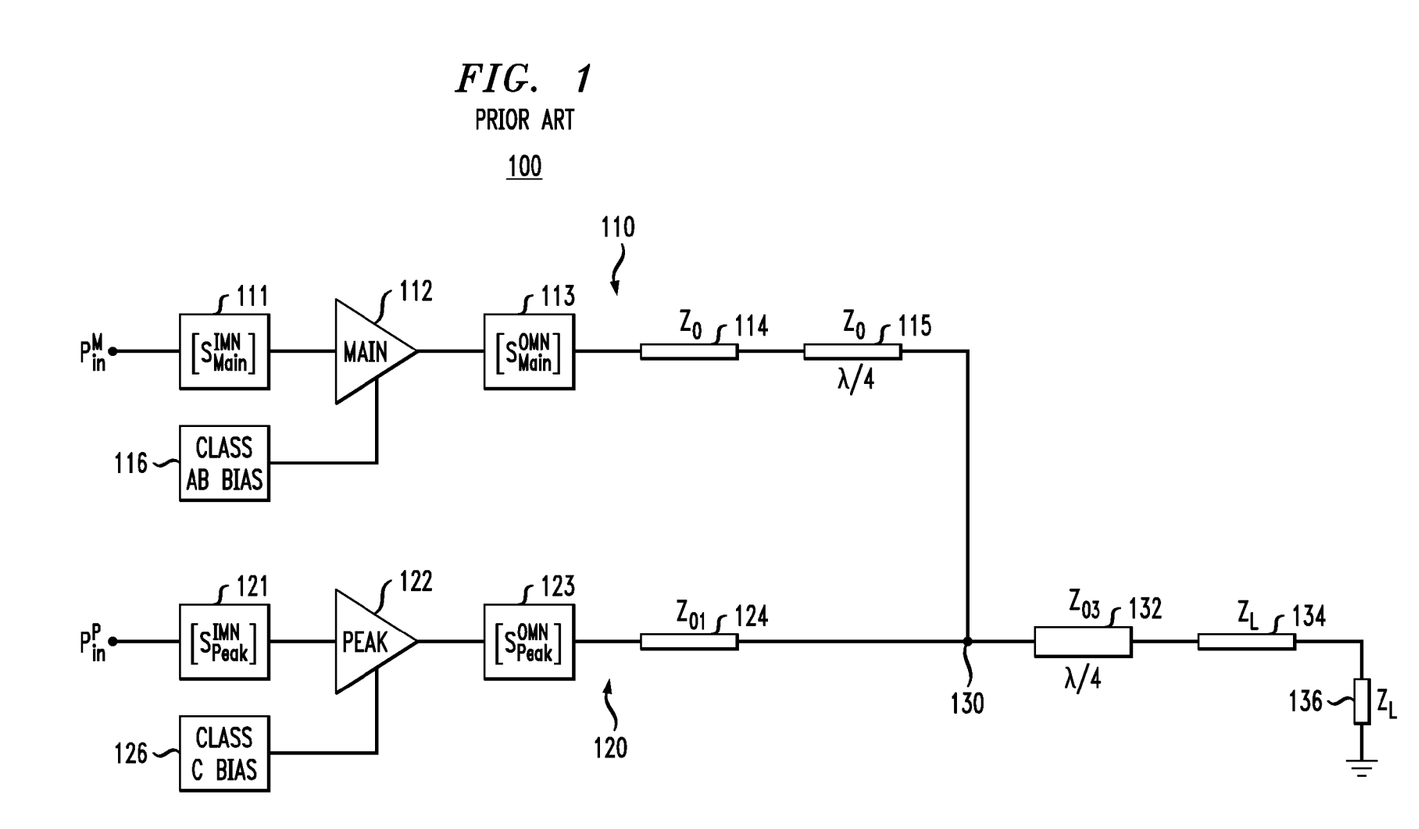
FIG. 1 shows a block diagram of a conventional two-way Doherty amplifier.

FIG. 1 shows a block diagram of a conventional two-way Doherty amplifier 100 having a main amplifier branch 110 and a peak amplifier branch 120. Main amplifier branch 110 consists of a cascade of a main input matching network 111, a main amplifier device (e.g., transistor) 112, a main output matching network 113, a main offset line 114, and a quarter-wave transformer 115, while peak amplifier branch 120 consists of a cascade of a peak input matching network 121, a peak amplifier device (e.g., transistor) 122, a peak output matching network 123, and a peak offset line 124. Output signals from the main and peak amplifier branches are combined at node 130 where branches 110 and 120 meet, and the resulting combined signal is delivered to the load 136 through a network consisting of a cascade of an output quarter-wave transformer 132 and a connecting line 134.

For a typical implementation of Doherty amplifier 100, for a particular signal frequency (or one or more particular ranges of signal frequencies), main and peak input matching networks 111 and 121 perform impedance transformation to convert from the relatively high impedance levels upstream of amplifier 100 down to relatively low impedance levels suitable for appropriate power transfer to (appropriate excitation of) main and peak amplifier devices 112 and 122. Similarly, main and peak output matching networks 113 and 123 perform a second impedance transformation to convert from the relatively low impedance levels of main and peak amplifier devices 112 and 122 back to relatively high impedance levels to achieve appropriate power extraction (or to achieve appropriate power delivery) from the devices. Note that, in general, the different impedance levels associated with main amplifier branch 110 may be, but do not have to be the same as the corresponding impedance levels associated with peak amplifier branch 120.

Main and peak offset lines 114 and 124 function as delays that apply phase rotations to their applied signals. Quarter-wave transformer 115 performs impedance inversion. For example, for a particular design and a particular signal frequency, quarter-wave transformer 115 performs impedance inversion whereby (i) input impedance levels below a particular impedance level $Z_0$ (e.g., 25 ohms) are converted into corresponding output impedance levels above that impedance level $Z_0$ (e.g., 100 ohms), and vice versa, while (ii) an input impedance at that impedance level $Z_0$ is output at that same impedance level. Output quarter-wave transformer 132 performs another impedance transformation to ensure that the output impedance of Doherty amplifier 100 matches the load impedance $Z_L$.

The input impedance matching networks 111 and 121 are implemented to enable proper RF power delivery to amplifier devices 112 and 122. The elements 113, 114, 115, 123, and 124 are implemented to provide high-efficiency impedance at low output power for the main amplifier device 112 and to enable high power delivery from both the main and peak amplifier devices 112 and 122 at high output power. Element 132 is implemented to transform load impedance (usually 50 ohm) to an appropriate impedance for combining node 130.

As shown in the exemplary implementation of FIG. 1, main bias controller 116 biases main amplifier 112 to operate as a class AB amplifier, while peak bias controller 126 biases peak amplifier 122 to operate as a class C amplifier, which causes peak amplifier 122 to be inactive for relatively low input signal levels and active for relatively high input signal levels.

Figure 2:
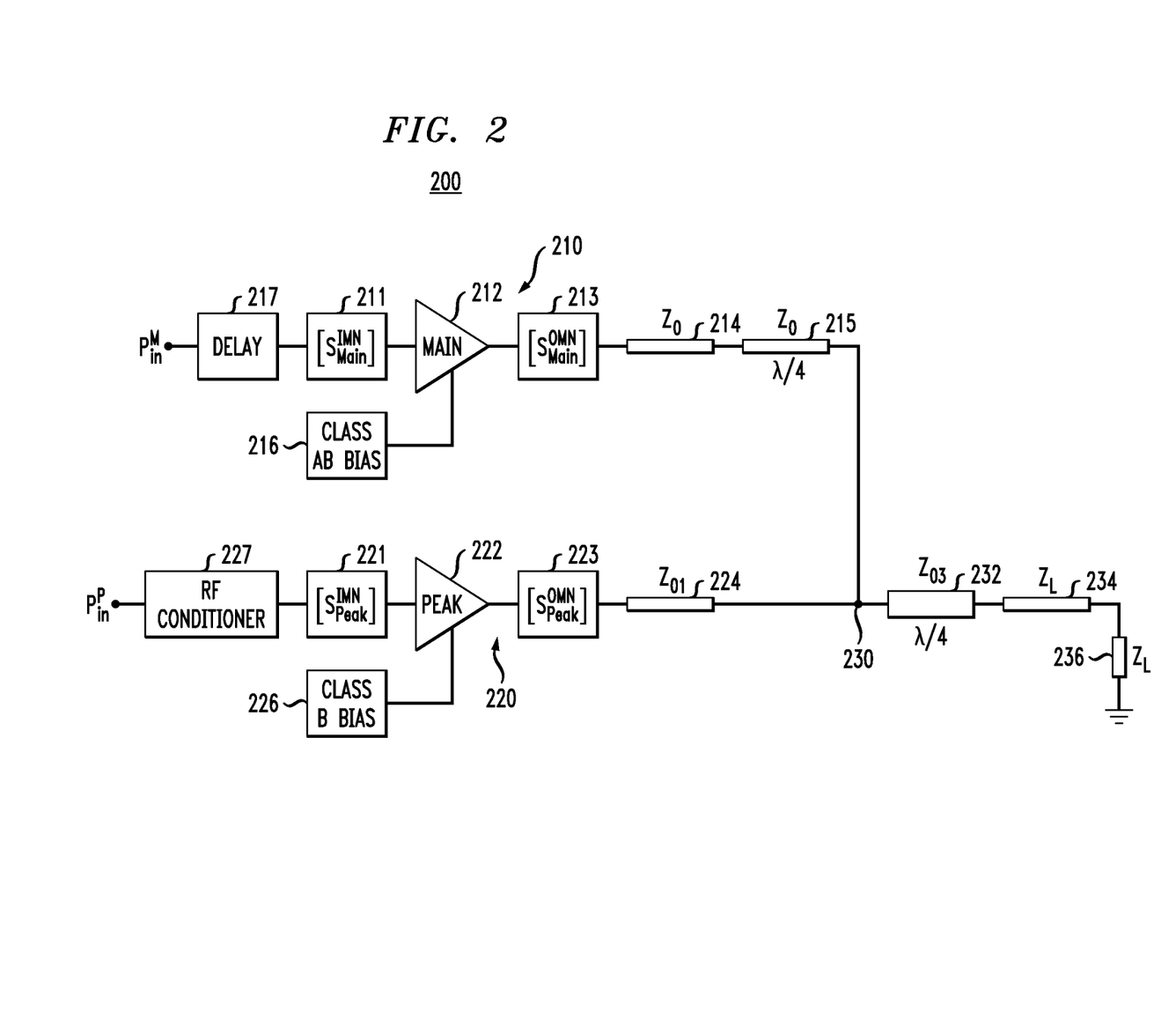
FIG. 2 shows a block diagram of a two-way Doherty amplifier according to one embodiment of the disclosure.

FIG. 2 shows a block diagram of a two-way Doherty amplifier 200 according to one embodiment of the disclosure having a main amplifier branch 210 and a peak amplifier branch 220. In two-way Doherty amplifier 200, elements 211-216, 221-224, and 230-236 are similar to the analogously labeled elements in two-way Doherty amplifier 100 of FIG. 1. In addition to those elements, two-way Doherty amplifier 200 also includes delay 217 and RF conditioner 227.

In operation, RF conditioner 227 conditions the peak branch RF input signal $P_{in}^P$ for application to the rest of the peak amplifier branch 220. According to certain embodiments, RF conditioner 227 prevents peak branch RF input signals having magnitudes lower than a specified threshold level from propagating any further along the peak amplifier branch, allowing only peak branch RF input signals having magnitudes greater than that threshold level from being applied to the rest of the peak amplifier branch. In this way, RF conditioner 227 can be used to control the threshold peak branch RF input signal level at which the peak amplifier branch becomes active.

This, in turn, allows peak amplifier 222 to be biased based on considerations other than the prior-art constraint of controlling that threshold peak branch RF input signal level. In particular, by independently controlling the level at which peak amplifier 222 starts to conduct, the bias applied by peak bias controller 226 to the transistor gate itself can be statically set in such a way as to achieve the desired gain and efficiency response. To maximize efficiency, peak amplifier 222 may be biased close to class B to maximize gain, while still maintaining zero or low quiescent current. Other bias modes including class C and class AB may also be utilized to change the shape of the gain curve to accommodate or compensate for other non-linear circuit behaviors. For example, as shown in FIG. 2, peak bias controller 226 is configured to bias peak amplifier 222 to operate as a class B amplifier, rather than as a class C amplifier as in prior-art, two-way Doherty amplifier 100 of FIG. 1.

In this way, gain and linearity can be optimized without sacrificing efficiency, and vice versa. As such, the adverse effects of transistor bias modes intrinsic to conventional high-efficiency Doherty amplifiers are mitigated. For example, the degree of compromise required between gain and linearity, on the one hand, and efficiency, on the other, can be minimized to achieve the high efficiency of a Doherty amplifier in a class C bias mode with the improved gain and linearity of a Doherty amplifier in a class B bias mode.

Delay 217 delays the main RF input signal $P_{in}^M$ to compensate for the processing delays of RF conditioner 227 in order to maintain synchronization between the main and peak amplifier branches.

This technique provides a method for decoupling the RF performance characteristics of a peak device (gain, efficiency, linearity, etc.) from the turn-on amplitude required for the device to start conducting. This enables the gain and efficiency to be maximized while maintaining linearity. In a fully dynamic implementation (described below), the ability to control these parameters enables further optimization of the devices used in the design potentially resulting in cost savings due to the use of different or smaller transistors relative to those which may be used in a conventional Doherty amplifier. Since this may be implemented as a frequency-independent circuit, this optimization may improve the frequency response and enhance the bandwidth of operation.

This technique is both frequency and device independent, and the same circuit can be used to support devices of any power level and technology (LDMOS, GaN, GaAs, etc.). Since the conditioning is performed on the RF signal itself, the peak amplifier device can be well characterized under a single bias mode to enable optimal design of the passive components surrounding the device.

Figure 3:
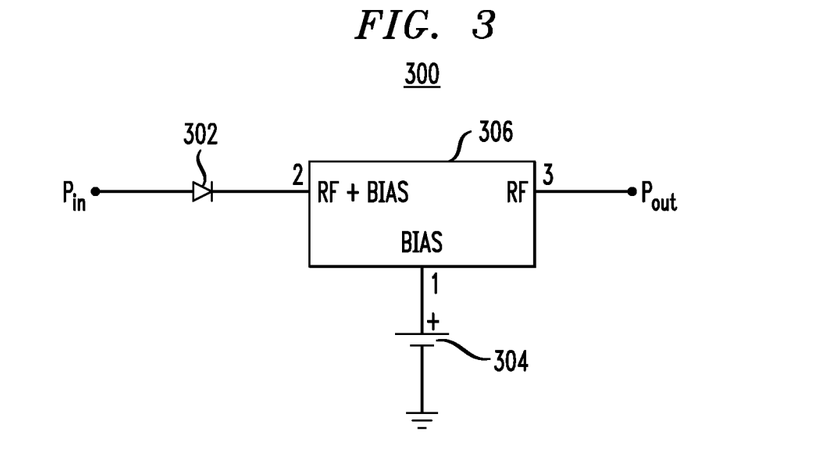
FIG. 3 shows a static RF conditioner that can be used to implement the RF conditioner of FIG. 2 according to one embodiment.

FIG. 3 shows a static RF conditioner 300 that can be used to implement RF conditioner 227 of FIG. 2 according to one embodiment. According to this embodiment, the peak branch RF input signal $P_{in}^P$ is applied to a reverse-biased diode 302 whose reverse-bias level is based on the desired threshold peak branch RF input signal level at which the peak amplifier branch is activated. In this way, diode 302 blocks peak branch RF input signals whose levels are below that threshold level from being applied to the rest of the peak amplifier branch, while allowing peak branch RF input signals whose levels are above that threshold level to propagate through.

As shown in FIG. 3, the reverse-bias signal is based on the voltage of fixed-voltage supply (e.g., battery) 304 and is applied to diode 302 via bias tee (i.e., directional coupler) 306. Bias tee 306 is configured such that the reverse-bias signal applied at port 1 is presented at port 2, but not at port 3. As such, only the RF signal that gets through diode 302 is presented at port 3 to the rest of the peak amplifier branch.

Because DC source 304 applies a constant reverse-bias voltage level, RF conditioner 300 is said to be a static RF conditioner.

Figure 4:
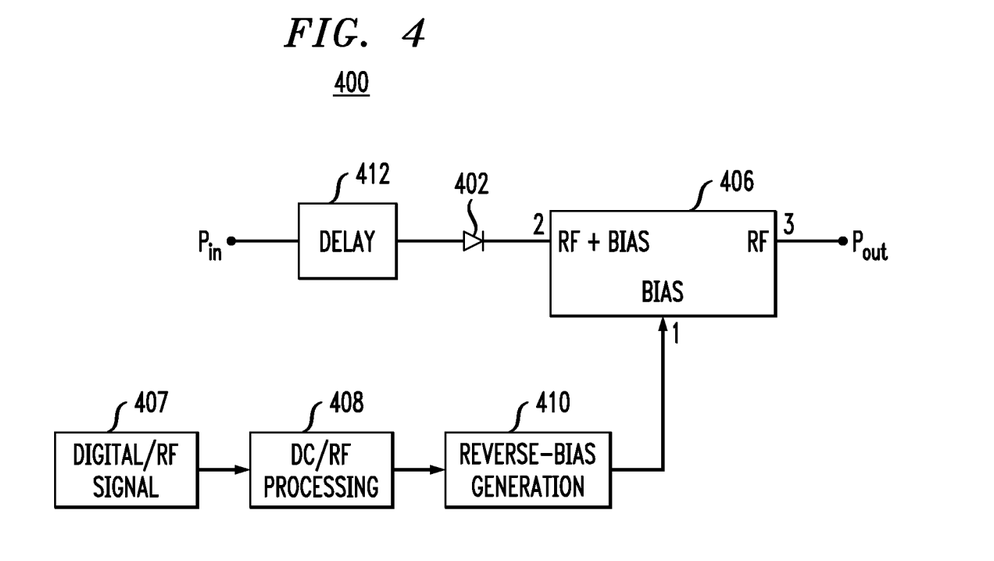
FIG. 4 shows a dynamic RF conditioner that can be used to implement the RF conditioner of FIG. 2 according to another embodiment.

FIG. 4 shows a dynamic RF conditioner 400 that can be used to implement RF conditioner 227 of FIG. 2 according to another embodiment. Analogous to static RF conditioner 300 of FIG. 3, dynamic RF conditioner 400 has a reverse-biased diode 402 that blocks low-level peak branch RF input signals and a bias tee 406 that applies the reverse-bias signal to diode 402. Instead of a battery that generates a static reverse-bias signal, however, dynamic RF conditioner 400 has components configured to generate a dynamic reverse-bias signal.

In particular, DC/RF processor 408 determines the envelope of an applied (digital or RF, depending on the implementation) signal 407, and reverse-bias generator 410 maps that determined envelope into the reverse-bias signal applied at port 1 of bias tee 406. In certain implementations, applied signal 407 is a copy of or a portion of the peak branch RF input signal $P_{in}^P$. In other implementations, applied signal 407 may be another suitable signal that is representative of the level of the peak branch RF input signal. Rather than determining the envelope of the applied signal, in alternative implementations, processor 408 may characterize some other measure of the relatively slowly varying, average peak magnitude of the applied signal.

Depending on the implementation, processor 408 and generator 410 may each be implemented in either an analog or digital domain. For example, when implemented in the analog domain, processor 408 may be an analog envelope detector. When implemented in the digital domain, processor 408 may be an IQ envelope detector. In general, processor 408 and generator 410 can be implemented in any manner suitable for the specific design requirements of the corresponding amplifier application.

As the envelope of applied signal 407 varies over time, the reverse-bias signal generated by generator 410 will also vary appropriately over time, thereby making RF conditioner 400 a dynamic RF conditioner. In particular, as the applied signal envelope increases, the applied reverse-bias voltage is decreased in order to lower the threshold for passing the input signal. In general, the signal conditioning applied to the peak branch RF input signal can be static, quasi-static, or dynamic.

In static signal conditioning, a single, relatively high level of reverse-bias voltage is applied to diode 402, thus preventing small input signals from reaching the peak amplifier. However, this static signal conditioning also reduces larger input signals reaching the peak amplifier, thus effectively lowering the gain of the peak branch as a whole.

In stepped static (aka quasi-static) signal conditioning, a first level of reverse-bias voltage is applied to the diode when the input signals are smaller than a specified threshold level, thereby preventing low-level input signals from reaching the peak amplifier. For input signals that are larger than that threshold level, a second, lower level of reverse-bias voltage is applied to the diode so that there is less reduction of the input signal level due to the diode's reverse bias and therefore less reduction of the gain of the peak branch.

In dynamic signal conditioning, the reverse-bias voltage applied to the diode is lowered in proportion to the increase in the input signal level, allowing for not only passing input signals above the specified threshold level, but also for correcting various nonlinearities of the diode and the peak amplifier.

Delay 412 delays the peak branch RF input signal $P_{in}^P$ to compensate for the processing delays of DC/RF processor 408 and reverse-bias generator 410 in order to maintain synchronization within the peak amplifier branch.

Figure 5:
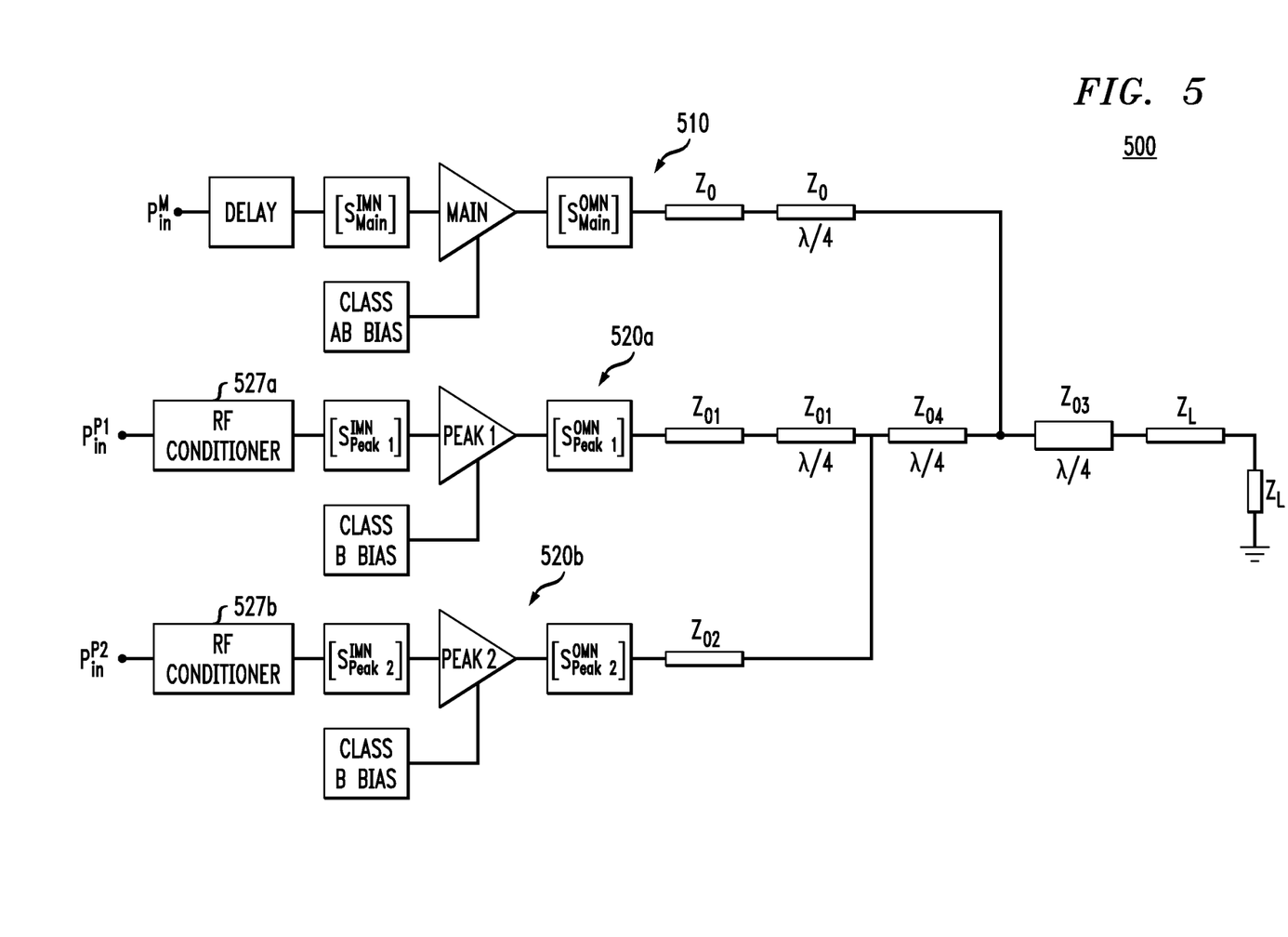
FIG. 5 shows a block diagram of a three-way Doherty amplifier according to one embodiment of the disclosure having a main amplifier branch and two independently-controlled peak amplifier branches.

FIG. 5 shows a block diagram of a three-way Doherty amplifier 500 according to one embodiment of the disclosure having a main amplifier branch 510 and two independently controlled peak amplifier branches 520a and 520b. In three-way Doherty amplifier 500, main amplifier branch 510 is analogous to main amplifier branch 200 of FIG. 2, and each peak amplifier branch 520 is analogous to peak amplifier branch 220 of FIG. 2. Note that, as shown in FIG. 5, each peak amplifier branch 520 has its own, independently operating RF conditioner 527, each implemented using a different instance of RF conditioner 300 of FIG. 3 or RF conditioner 400 of FIG. 4 or any other suitable RF conditioner. Note that two different types of RF conditioners can be used to implement RF conditioners 527a and 527b. This independently controlled peak-branch architecture can be extended to form a generic N-way Doherty amplifier having a main amplifier branch and N−1 independently controlled peak amplifier branches, where N is an integer greater than 2.

Figure 6:
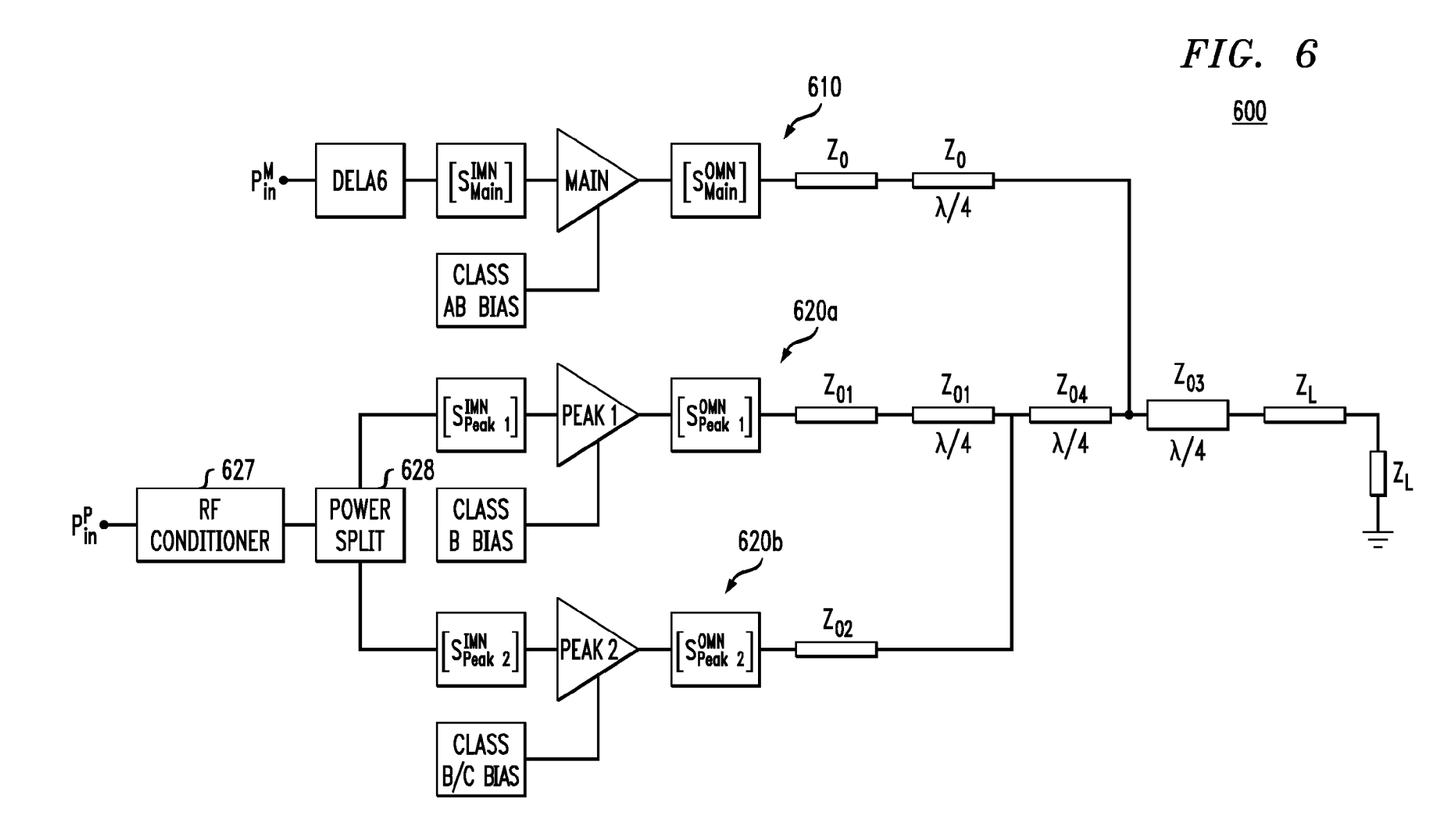
FIG. 6 shows a block diagram of a three-way Doherty amplifier according to another embodiment of the disclosure having a main amplifier branch and two dependently-controlled peak amplifier branches.

FIG. 6 shows a block diagram of a three-way Doherty amplifier 600 according to another embodiment of the disclosure having a main amplifier branch 610 and two dependently controlled peak amplifier branches 620a and 620b. In three-way Doherty amplifier 600, main amplifier branch 610 is analogous to main amplifier branch 200 of FIG. 2, and each peak amplifier branch 620 is analogous to peak amplifier branch 220 of FIG. 2. Note that, as shown in FIG. 6, the two peak amplifier branches 620a and 620b share a single RF conditioner 627 implemented using a single instance of RF conditioner 300 of FIG. 3 or RF conditioner 400 of FIG. 4 or any other suitable RF conditioner. In this case, the conditioned peak branch RF input signal generated by RF conditioner 627 is split (evenly or unevenly depending on the implementation) by power splitter 628 between the two peak amplifier branches. This dependently controlled peak-branch architecture can be extended to form a generic N-way Doherty amplifier having a main amplifier branch and N−1 dependently controlled peak amplifier branches, where N is an integer greater than 2.

The architectures of FIGS. 5 and 6 can be combined to form a generic, hybrid N-way Doherty amplifier having a main amplifier branch and N−1 peak amplifier branches, where the peak amplifier branches are configured into two or more independently controlled sets, each set comprising either a single peak amplifier branch or two or more dependently controlled peak amplifier branches, where each RF conditioner in the hybrid N-way Doherty amplifier is implemented using an instance of RF conditioner 300 of FIG. 3 or RF conditioner 400 of FIG. 4 or any other suitable RF conditioner, where N is an integer greater than 3.

While this invention has been described with reference to illustrative embodiments, this description is not intended to be construed in a limiting sense. For example, although the disclosure has been described in the context of RF conditioners implemented using reverse-biased diodes, other embodiments may be implemented using DC blocks, RF chokes, and/or other suitable lumped elements (e.g., resistors, capacitors, inductors, etc.) to achieve analogous functionality.

Various modifications of the described embodiments, as well as other embodiments of the invention, which are apparent to persons skilled in the art to which the invention pertains are deemed to lie within the principle and scope of the invention as expressed in the following claims.

Signals and corresponding nodes, ports, or paths may be referred to by the same name and are interchangeable for purposes here.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

What is claimed is:

1. An apparatus having an amplifier comprising:
   a main amplifier branch configured to amplify a main input signal; and
   one or more peak amplifier branches configured to amplify one or more corresponding peak branch input signals, wherein at least one peak amplifier branch comprises:
   an RF conditioner configured to condition the corresponding peak branch input signal to generate a conditioned peak branch input signal, wherein the RF conditioner inhibits the corresponding peak branch input signal having a magnitude below a specified threshold level from propagating along the at least one peak amplifier branch as the conditioned peak branch input signal; and
   a peak amplifier configured to amplify the conditioned peak branch input signal; and
an output matching network configured to combine amplified outputs of the main amplifier branch and the one or more peak amplifier branches to generate an amplified output of the amplifier.

2. The invention of claim 1, wherein the RF conditioner comprises:
   a reverse-biased diode configured to (i) be reverse-biased by a bias signal, to (ii) receive the corresponding peak branch input signal, and to (iii) apply the conditioned peak branch input signal to the peak amplifier only if the corresponding peak branch input signal is greater than a threshold level corresponding to the bias signal; and
   a bias-signal generator configured to generate the bias signal.

3. The invention of claim 2, wherein the bias-signal generator is configured to generate the bias signal as a static bias signal.

4. The invention of claim 3, wherein the bias-signal generator is a fixed-voltage supply.

5. The invention of claim 2, wherein the bias-signal generator is configured to generate the bias signal as a dynamic bias signal.

6. The invention of claim 5, wherein the bias-signal generator dynamically updates the dynamic bias signal based on an envelope of a generator input signal.

7. The invention of claim 6, wherein the generator input signal is based on the corresponding peak branch input signal.

8. The invention of claim 6, wherein the RF conditioner further comprises an envelope detector configured to detect the envelope of the generator input signal.

9. The invention of claim 1, wherein the amplifier comprises a plurality of peak amplifier branches, wherein:
   a first peak amplifier branch is configured amplify a first conditioned peak branch input signal; and
   a second peak amplifier branch is configured amplify a second conditioned peak branch input signal.

10. The invention of claim 9, wherein the first conditioned peak branch input signal and the second conditioned peak branch input signal are generated independently.

11. The invention of claim 10, wherein:
    the first peak amplifier branch comprises:
       a first RF conditioner configured to condition a first peak branch input signal to generate the first conditioned peak branch input signal; and
       a first peak amplifier device configured to amplify the first conditioned peak branch input signal; and
    the second peak amplifier branch comprises:
       a second RF conditioner configured to condition a second peak branch input signal to generate the second conditioned peak branch input signal; and
       a second peak amplifier device configured to amplify the second conditioned peak branch input signal.

12. The invention of claim 9, wherein the first conditioned peak branch input signal and the second conditioned peak branch input signal are generated dependently.

13. The invention of claim 12, wherein:
    the amplifier comprises:
       a shared RF conditioner configured to condition a shared peak branch input signal to generate a conditioned shared peak branch input signal; and
       a splitter configured to split the conditioned shared peak branch input signal into the first conditioned peak branch input signal and the second conditioned peak branch input signal;
    the first peak amplifier branch comprises a first peak amplifier device configured to amplify the first conditioned peak branch input signal; and
    the second peak amplifier branch comprises a second peak amplifier device configured to amplify the second conditioned peak branch input signal.

14. The invention of claim 1, wherein the amplifier is a Doherty amplifier.

15. The invention of claim 1, wherein the apparatus is an integrated circuit.

16. A method comprising:
    (a) amplifying a main input signal using a main amplifier branch; and
    (b) amplifying one or more corresponding peak branch input signals using one or more peak amplifier branches, wherein at least one peak amplifier branch:
       (b1) conditions the corresponding peak branch input signal to generate a conditioned peak branch input signal, wherein the conditioning inhibits the corresponding peak branch input signal having a magnitude below a specified threshold level from propagating along the at least one peak amplifier branch as the conditioned peak branch input signal; and
       (b2) amplifies the conditioned peak branch input signal; and
    (c) combining amplified outputs of the main amplifier branch and the one or more peak amplifier branches using an output matching network to generate an amplified output of the amplifier.

* * * * *